United States Patent
Irving et al.

(10) Patent No.: US 7,796,384 B2
(45) Date of Patent: Sep. 14, 2010

(54) HYBRID CHASSIS COOLING SYSTEM

(75) Inventors: Eric Irving, Albuquerque, NM (US);
Charles Pinney, Albuquerque, NM (US); Tom Hensley, Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/199,416

(22) Filed: Aug. 27, 2008

(65) Prior Publication Data

US 2010/0053901 A1 Mar. 4, 2010

(51) Int. Cl.
*H05K 7/20* (2006.01)

(52) U.S. Cl. .................. 361/694; 361/695; 361/715; 454/184

(58) Field of Classification Search .................. 361/694
See application file for complete search history.

(56) References Cited

U.S. PATENT DOCUMENTS

| | | | | |
|---|---|---|---|---|
| 4,298,904 A | * | 11/1981 | Koenig ..................... 361/720 |
| 4,318,157 A | * | 3/1982 | Rank et al. ................. 361/704 |
| 5,036,428 A | * | 7/1991 | Brownhill et al. ........... 361/721 |
| 5,260,587 A | * | 11/1993 | Sato ............................ 257/88 |
| 5,414,592 A | * | 5/1995 | Stout et al. ................. 361/704 |
| 5,718,117 A | | 2/1998 | McDunn et al. ............... 62/64 |
| 5,827,585 A | | 10/1998 | Giannetti |
| 5,831,824 A | | 11/1998 | McDunn et al. ............. 361/699 |
| 5,835,349 A | | 11/1998 | Giannatto et al. ........... 361/701 |
| 5,859,764 A | * | 1/1999 | Davis et al. ................. 361/704 |
| 5,871,042 A | | 2/1999 | Gutfeldt et al. ............... 165/70 |
| 5,966,289 A | * | 10/1999 | Hastings et al. ............. 361/704 |
| 5,982,619 A | | 11/1999 | Giannatto et al. ........... 361/701 |
| 6,026,565 A | | 2/2000 | Giannatto et al. ............. 29/830 |
| 6,139,361 A | | 10/2000 | Przilas et al. ............... 439/559 |
| 6,212,075 B1 | * | 4/2001 | Habing et al. ............... 361/719 |
| 6,246,582 B1 | * | 6/2001 | Habing et al. ............... 361/704 |
| 6,430,052 B1 | | 8/2002 | Kordes et al. |
| 6,621,706 B2 | * | 9/2003 | Tzlil et al. ................... 361/719 |
| 6,721,182 B1 | * | 4/2004 | Wells et al. ................. 361/704 |
| 6,765,798 B1 | * | 7/2004 | Ratliff et al. ................ 361/704 |
| 7,150,109 B2 | | 12/2006 | Knight et al. .................. 34/62 |

(Continued)

FOREIGN PATENT DOCUMENTS

EP 1 853 097 A2 11/2007

(Continued)

OTHER PUBLICATIONS

European Search Report from corresponding EP Application No. 09163468.3, mailed Oct. 26, 2009, 5 pages.

*Primary Examiner*—Gregory D Thompson
(74) *Attorney, Agent, or Firm*—Shumaker & Sieffert, P.A.

(57) ABSTRACT

In a system for housing electronics cards, methods and systems for cooling the electronics cards are presented. Each electronics card preferably contains heat-producing electronics and a heat sink, and is preferably placed within a card guide of the chassis and secured into position with a clamping device. At least one of the heat sink, the card guide, the clamping device, and a cold wall of the chassis are used to facilitate the conduction cooling of the heat-producing electronics. Furthermore, a clamping device may rigidly secure a card into position, thus reducing the impact of vibrations (including shock) on the card. Additionally, an air flow further cools the electronics cards, the card guides, and/or the cold wall.

22 Claims, 5 Drawing Sheets

U.S. PATENT DOCUMENTS

| | | |
|---|---|---|
| 7,254,025 B2 | 8/2007 | Baldwin, Jr. ................ 361/700 |
| 7,349,112 B2 * | 3/2008 | Kusaka ..................... 358/1.15 |
| 2003/0223197 A1 | 12/2003 | Hulan et al. |
| 2004/0070944 A1 | 4/2004 | Wells et al. |
| 2005/0168941 A1 | 8/2005 | Sokol et al. ................ 361/688 |
| 2008/0019102 A1 | 1/2008 | Yurko |
| 2009/0213543 A1 * | 8/2009 | Nemoz et al. ............... 361/694 |

FOREIGN PATENT DOCUMENTS

| | | |
|---|---|---|
| FR | 2 650 146 | 7/1989 |
| WO | 00/41448 | 7/2000 |
| WO | 2008/033297 A2 | 3/2008 |

\* cited by examiner

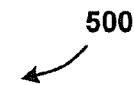
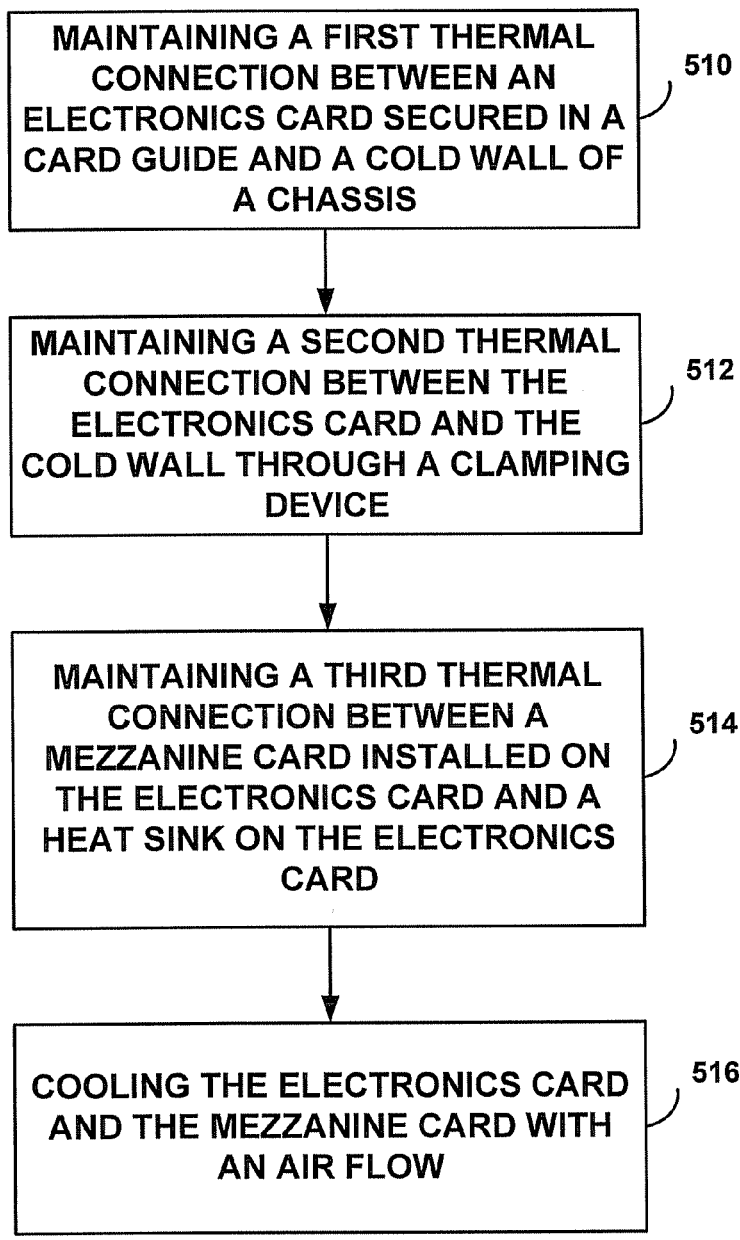
FIG. 5

HYBRID CHASSIS COOLING SYSTEM

GOVERNMENT RIGHTS

The United States Government may have acquired certain rights in this invention pursuant to Contract No. W31P4Q-07-C-0182 with DARPA.

FIELD

The embodiments herein relate to methods and systems for cooling electronics cards housed within a chassis.

BACKGROUND

Card-style printed board assemblies are typically used to contain electronics components in an electronics enclosure. These electronics cards may contain off-the-shelf or custom electronics components, such as central processing units (CPUs), application-specific integrated circuits (ASICs), field-programmable gate arrays (FPGAs), digital signal processors (DSPs), network processors, graphics processing units (GPUs), memory units, communication interfaces, communication busses, and so on. These components normally produce heat when active. Electronics cards containing such heat-producing electronics may be used, for example, in the fields of avionics, transportation, or communications.

As newer electronics components exhibiting improved performance are developed, they also may draw more electrical power and produce more heat than previous generations of electronics components. This additional heat needs to be dissipated or removed from the cards and the chassis in order to ensure that the electronics system does not overheat. Furthermore, electronics systems may be deployed in an environment that is subject to significant vibration, such as a commercial or military aircraft. Thus, modern electronics system design calls for addressing at least the problems of providing heat dissipation for the electronics components on the electronics cards as well as structural support for the electronics cards and the chassis in the presence of vibration.

Current off-the-shelf convection cooling and conduction cooling technologies both individually fail to solve all of these problems. Thus, an improved method of cooling these types of systems is desirable.

SUMMARY

In order to improve the cooling and securing of electronics in a chassis, a hybrid cooling system, using both conduction-based and convection-based cooling is introduced. In this system, a convection-cooled chassis may be modified to dissipate heat using card guides, cold walls, or both card guides and cold walls, that are designed for heat conduction.

Electronics cards are secured in the chassis. Preferably, the electronics cards each comprise heat-producing electronics and a heat sink coupled with these heat-producing electronics. Electronics cards are placed in the chassis such that the heat sink on each card is preferably coupled with a card guide and/or a cold wall, thereby dissipating heat from the heat-producing electronics to the card guide and/or cold wall, via a heat sink.

Furthermore, each electronics card is preferably secured in the chassis with a clamping device, such as a wedgelock. The clamping device may serve two purposes. First, it is preferably comprised of a heat-conducting material, and it is preferably coupled with both the heat sink on an electronics card and a card guide and/or a cold wall of the chassis. Thus, the clamping device may further conduct heat away from the heat-producing electronics to a card guide and/or a cold wall via the heat sink on the electronics card. Second, the clamping device may rigidly secure the electronics card into a card guide, or slot, in the chassis, thereby reducing the impact of vibrations (including shock) on the electronics card.

Additionally, each electronics card may comprise a mezzanine card mounting location for supporting the insertion of a mezzanine card into the electronics card. The mezzanine card may enhance the electronics card with supplementary memory, processing capability or other functions. A mezzanine card so inserted into an electronics card may be cooled by conduction, convection, or both.

The chassis may also contain a fan unit, comprising one or more fans, that blows air over the electronics cards and out of a vent in the chassis, thereby cooling the cards. Alternatively, the chassis may be cooled by one or more external fans or by other cooling techniques. Regardless of the convection technique used, an air flow is preferably provided, thus further cooling the heat-producing electronics, heat sink(s) on the electronics cards, and cold wall(s).

These arrangements preferably allow a conduction-cooled electronics system to be supported in a low-cost convection-cooled chassis. Furthermore, by mitigating the vibrations that the electronics cards are subjected to, such an electronics system can be deployed in commercial and military avionics systems.

These and other aspects and advantages will become apparent to those of ordinary skill in the art by reading the following detailed description, with reference where appropriate to the accompanying drawings. Further, it should be understood that the foregoing overview is merely exemplary and is not intended to limit the scope of the invention as claimed.

BRIEF DESCRIPTION OF THE DRAWINGS

FIG. 5 is another flow chart of a method for cooling electronics cards in a chassis.

DESCRIPTION

Figure 1:
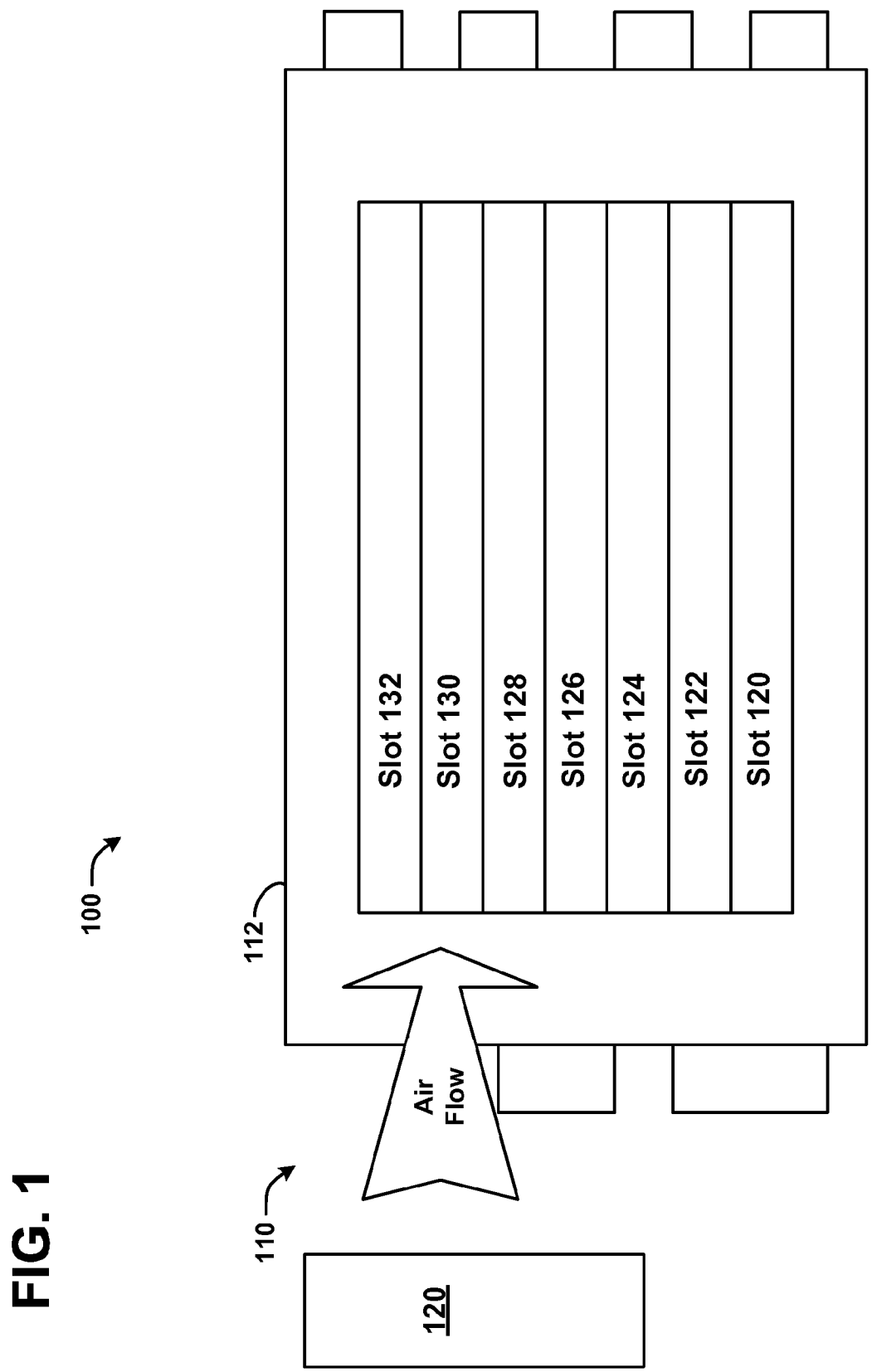
FIG. 1 is a diagram of a hybrid chassis cooling system.

An electronics chassis, containing one or more electronics cards, may be used in avionics systems (such as military and commercial aircraft), transportation systems (such as automobiles, trains, and military vehicles), and telecommunications systems (such as circuit and packet switching equipment), as well as in other types of systems. Regardless of the purpose of the system, such a chassis is usually subject to at least two design goals: (1) avoiding overheating, and (2) reducing the impact of vibration on the system.

Electronics components generate heat, and in general, the more powerful the components, the more heat they typically generate. Thus, as newer and more advanced electronic components are deployed in these systems, the need for improved cooling technology grows. When electronics overheat, the electronics may produce incorrect results, fail intermittently, or fail completely.

Electronics systems may be deployed in scenarios that are subject to vibrations. For example, an avionics system in a commercial or military aircraft may experience vibrations in the normal course of flight. Particularly severe vibrations could cause the electronics to abruptly fail or become faulty. As more aircraft manufacturers adopt "fly-by-wire" designs, in which the aircraft is controlled electronically instead of mechanically, housing electronics in a vibration-resilient fashion becomes important.

Typically, a telecommunications system experiences only minimal vibrations in a normal setting, such as the central office of a telecommunications service provider. However, it is desirable for telecommunications systems to be designed to withstand vibrations that may be produced by earthquakes or explosions. Furthermore, mobile wireless base stations or other types of telecommunications equipment may be deployed for military, national security, or disaster recovery purposes. Such a system is preferably designed to withstand vibrations associated with these settings.

Two common methods for cooling electronics are convection cooling and conduction cooling. Convection cooling typically utilizes a liquid or gas to transfer heat from one place to another, and may be either free or forced. Free convection cooling relies upon the natural flow of heat due to temperature gradients or convection currents. Forced convection cooling uses an external source of motion, such as a fan, vacuum, or pump, to actively provide an air flow, thereby transferring heat.

As an example of forced convection, a system housing electronics may use one or more fan units to propel a forced airflow over the electronic components on the electronics cards, thus cooling these components. The resulting heated air is then vented out of the chassis. The fans may be within the chassis or may be external to or otherwise separate from the chassis.

Convection cooling is advantageous in that it is simple and cost effective (for example, a convection-cooled electronics card may not require a heat sink). However, off-the-shelf implementations of convection cooled systems may suffer from poor resistance to vibration.

Conduction cooling takes advantage of the natural flow of heat from a warmer body to a cooler body. On an electronics card, this usually involves coupling the card's heat-producing electronics with a heat sink. The heat sink may be composed from aluminum, copper, graphite, carbon fiber, or some other element, compound or alloy. The heat sink preferably moves heat produced by the electronic components on the card off of the heat-producing electronics, and may further conduct heat to cooling components, such as cold walls built into the chassis. Cold walls are also preferably composed from aluminum, copper, graphite, carbon fiber, or some other element, compound or alloy, and may serve to dissipate heat from the chassis.

Conduction cooling typically transfers heat more effectively than convection cooling. Furthermore, off-the-shelf conduction-cooled electronics cards may be designed to better withstand vibrations than off-the-shelf convection-cooled electronics cards. However, conduction-cooling typically requires heat sinks, one or more cold walls, and potentially a custom design, thus increasing the cost and complexity of both the chassis and the electronics cards.

Thus, it is desirable to combine the low cost of convection cooling systems with the superior heat transfer abilities of conduction cooled systems to form a hybrid chassis cooling system that both cools the system's electronics components and protects them from vibrations. A preferred embodiment involves modifying a convection-cooled chassis by adding heat-conducting or heat-dissipating card guides and cold walls. These modifications can be taken advantage of by securing electronics cards in the modified chassis so that the electronics cards are thermally coupled to the card guides and/or the cold walls.

Such an arrangement of electronics cards in a modified chassis may be further cooled by convection techniques. For example, the convection cooling may be passive, and therefore rely on natural convection to transfer heat away from the electronics cards. Alternatively, the convection cooling may be active, but may not employ a self-contained fan. For example, such a system used in an aircraft may employ aircraft-supplied cooling air. In this case, the chassis may contain an orifice that mates with an air-tight seal on the aircraft. The chassis preferably uses this interface to gain access to the aircraft's air system, and in doing so the chassis has access to cooling air. As another alternative, the chassis may contain one or more fan units for forcing air over the electronics cards.

So configured, a convection-cooled chassis modified for hybrid convection and conduction cooling may be of a simpler design and more cost effective than a conduction-cooled chassis, but exhibit superior cooling when compared to an off-the-shelf convection cooled chassis. Further alternatives are possible as well. While the description below is directed to preferred embodiments of such a hybrid cooling system, the description should not be construed to be limited to just these embodiments.

I. Hybrid Chassis Cooling System

FIG. 1 depicts a top view 100 of an exemplary chassis. Preferably the chassis is a convection-cooled chassis that is modified to facilitate a combination of convection-cooling and conduction-cooling. The chassis comprises walls 112, which may include one or more cold walls (not shown). The chassis also comprises multiple slots 120, 122, 124, 126, 128, 130, 132 each for securing an electronics card. However, electronics cards need not be placed in each of these slots in order for the chassis to operate. One or more walls 112 may include or be coupled with card guides to facilitate sliding electronics cards into slots 120, 122, 124, 126, 128, 130, 132.

Electronics cards may be secured into these slots by various types of fastening devices, including but not limited to screws, clips, clamps, and wedgelocks. The coupling of the electronics cards to the chassis may form thermal connections between components on the electronics cards (e.g., heat sinks) and the card guides and/or cold walls of the chassis. In this way, heat is conducted away from the heat-producing electronics on the electronics cards, thereby cooling the heat-producing electronics.

Slots 120, 122, 124, 126, 128, 130, 132 may secure more than one type of electronics card. For example, the types of electronics cards housed in these slots may include processing cards for facilitating computation, interface cards for facilitating communication between the processing cards and devices outside the chassis, switching cards for facilitating communication between cards in the chassis, and power supply cards for providing electrical power to electronics cards in the chassis.

A single electronics card can be designed to utilize more than one slot in a chassis. Furthermore, some of slots 120, 122, 124, 126, 128, 130, 132 may remain empty, either because their use is not required by the system, or to facilitate an increased air flow across electronics cards that are placed in the chassis.

Air flow 110 provides convection cooling to the chassis and electronics cards secured in slots 120, 122, 124, 126, 128, 130, 132. Air flow 110 is preferably facilitated by input vents (not shown) and output vents (also not shown). Such vents may be placed at various locations in the chassis, for instance, in the side walls, the top, or the bottom of the chassis. Additionally, the chassis may also include one or more fan units 120 forcing air flow 110 through the chassis, further cooling any heat-producing electronics and/or heat sinks on the electronics cards. Preferably these fan units are arranged to provide sufficient cooling to all electronics cards, as well as to other components in the chassis.

It should be understood, however, that this and other arrangements of components described herein are set forth for purposes of example only. Other arrangements and components (e.g., devices, interfaces, functions, orders of components, etc.) can be added or used, and some components may be omitted altogether.

Figure 2:
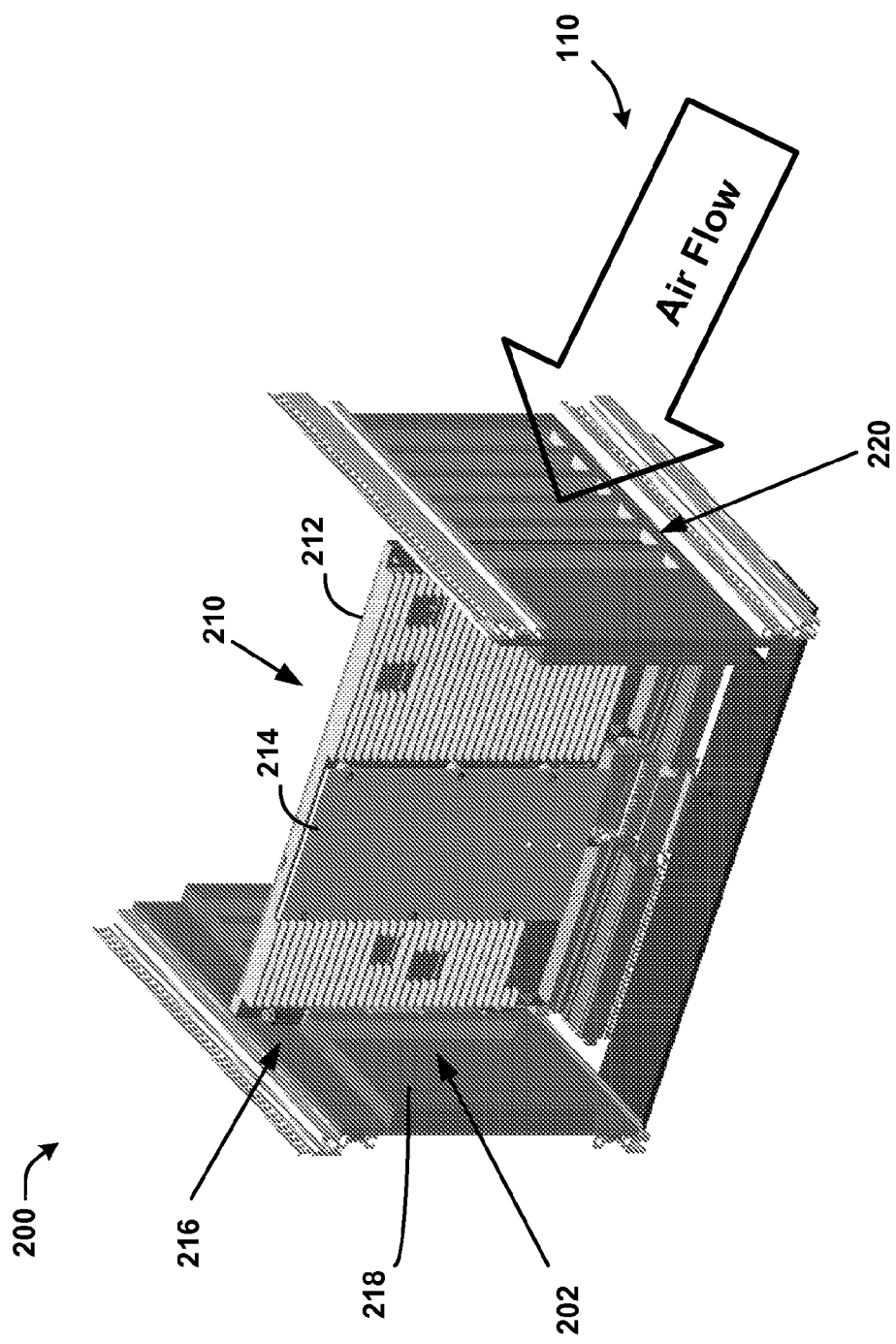
FIG. 2 is another diagram of a hybrid chassis cooling system.

FIG. 2 depicts a side view 200 of an exemplary chassis. In side view 200, two sides and the top of the chassis are not shown so that the chassis internals are better displayed. Among other components, the chassis comprises card guides 202 for facilitating the placement and the securing of electronics cards in the chassis. Preferably the chassis is a convection-cooled chassis that is modified to facilitate a combination of convection-cooling and conduction-cooling. Such a modification may include using card guides made from a heat-conducting material, such as aluminum, copper, graphite, carbon fiber, or some other element, compound or alloy. Doing so allows the card guides and any surrounding parts of the chassis to be used as a cold wall, such as cold wall 218 shown in FIG. 2, thus further dissipating heat from the electronics cards.

Side view 200 includes an electronics card 210. Naturally, more than one electronics card may be placed in the chassis, but for purposes of illustration only electronics card 210 is shown. Electronics card 210 comprises heat sink 212, mezzanine card 214, and wedgelock 216. Heat-producing electronics are preferably located on electronics card 210 under heat sink 212. These heat producing electronics may include, but are not limited to, CPUs, ASICs, FPGAs, DSPs, network processors, GPUs, memory units, communication interfaces, communication busses, and so on. Heat sink 212 is preferably coupled to these heat-producing electronics via a substrate, for example a thermal grease, gel, or interface material. The substrate may be comprised of silicon, glass, a polymer, or other elements or compounds. Examples of such substrates are manufactured by companies including Thermagon, Fuji-Poly, and Honeywell.

This arrangement allows heat to be conducted away from the heat-producing electronics and to heat sink 212. To facilitate heat transfer, heat sink 212 may be made of aluminum, copper, graphite, carbon fiber, or some other element, compound or alloy. Heat sink 212 is preferably constructed with a large surface area so that heat absorbed by heat sink 212 is effectively dissipated.

Mezzanine card 214 is preferably an adjunct or daughter-card device that is inserted into a mezzanine mounting location or slot (not shown) on electronics card 210. Mezzanine card 214 may enhance electronics card 210 with supplementary memory, processing capability, or other functions. For example, mezzanine card 214 may include a CPU, ASIC, FPGA, DSP, network processor, GPU, memory unit, communication interface, and/or a communication bus. Mezzanine card 214 so inserted into electronics card 210 may be coupled with heat sink 212, thereby cooling mezzanine card 214 by conduction. The mezzanine card slot may be compatible with a PCI Industrial Computers Manufacturers Group (PICMG), an Advanced Mezzanine Card (AMC) specification, a PCI Mezzanine Card (PMC) specification, an Institute of Electrical and Electronics Engineers (IEEE) 1386 standard, or any other appropriate industry standard or proprietary technology.

Figure 3:
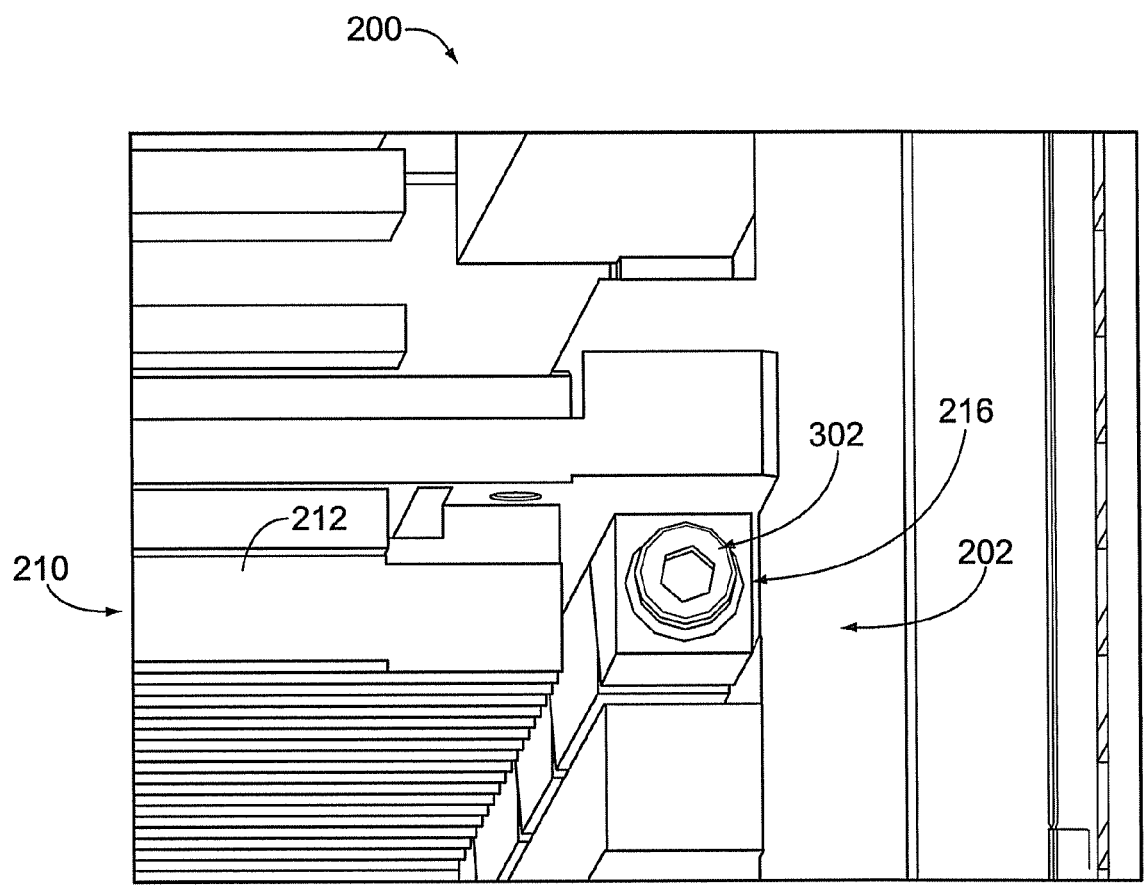
FIG. 3 is a diagram of a wedgelock securing an electronics card into a card guide.

Electronics card 210 is preferably secured to the chassis with wedgelock 216. Turning momentarily to FIG. 3, top view 300 shows a portion of electronics card 210, wherein electronics card 210 is inserted into card guide 202. Wedgelock 216 is in the relaxed position, thus leaving a gap between wedgelock 216 and card guide 202. However, turning hex screw 302 on top of wedgelock 216 causes wedgelock 216 to expand, thus filling the gap and rigidly coupling electronics card 210 to card guide 202. In this way, wedgelock 216 mitigates the impact of vibration on electronics card 210. Wedgelock 216 may also comprise heat-conducting materials, such as aluminum, copper, graphite, carbon fiber, or some other element, compound or alloy. Thus, wedgelock 216 may further facilitate the transfer of heat from the heat-producing electronics on electronics card 210, or from heat sink 212, to a cold wall either comprising or coupled to card guide 202.

Wedgelock 216 is a preferred embodiment of a clamping device that can be used to secure an electronics card into a card guide. Additional preferred embodiments may include other types of clamping devices, or means for securing electronics cards, that may be used in similar or different arrangements as displayed in FIG. 3.

Turning back to FIG. 2, air flow 110 provides convection cooling of electronics card 210 and mezzanine card 214 by dissipating heat from heat sink 212 and/or the heat-producing electronics on electronics card 210 and mezzanine card 214. Air flow 110 may also cool other components in the chassis, such as a cold wall 218 and or/card guide 202. While FIG. 2 depicts air flow 110 entering the chassis from a particular location through one or more vents 220, air flow 110 may alternatively enter the chassis from one or more different locations, may flow along various paths, and may be produced by one or more fan units 120 (FIG. 1) that are either inside or outside of the chassis. Alternatively, a forced air flow may be supplied by a pump, vacuum, or by other means.

It should be understood, however, that this and other arrangements described herein are set forth for purposes of example only. As such, those skilled in the art will appreciate that other arrangements and other components (e.g., machines, interfaces, functions, orders of functions, etc.) can be used instead, and some components may be omitted altogether.

II. Exemplary Hybrid Cooling Methods

Each of the methods described below are for purposes of example. In each method, more or fewer steps may be used, and the steps may be carried out in a different order than is illustrated below. Additionally, these methods may be combined with one another in multiple arrangements. However, preferred embodiments are not limited to these methods or any combination of these methods. Furthermore, while certain steps of these methods are described below as being carried out by a particular device or element, these steps may alternatively be carried out by other devices or elements.

Figure 4:
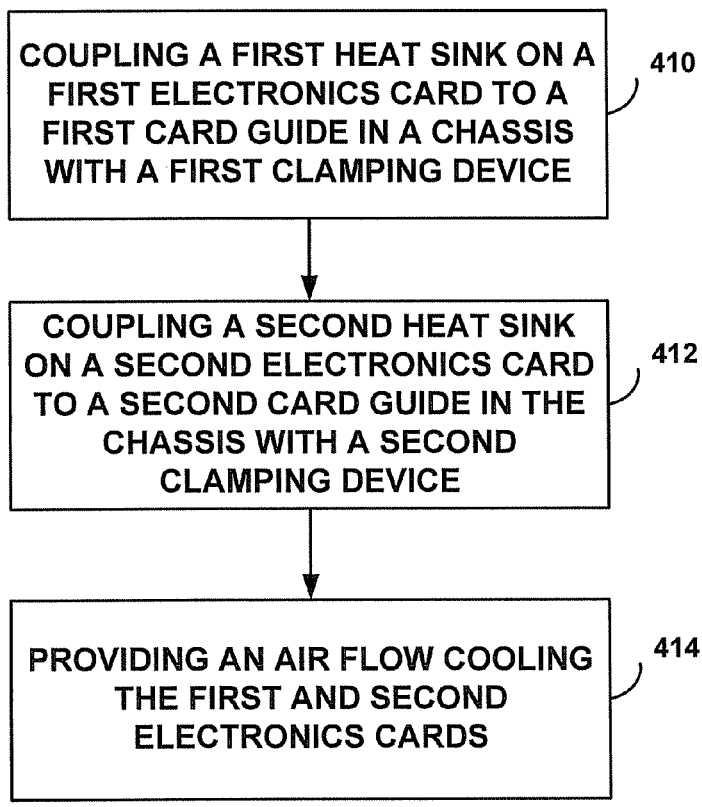
FIG. 4 is a flow chart of a method for cooling electronics cards in a chassis.

FIG. 4 depicts flow chart 400 for cooling electronics cards in a chassis. At step 410, a first heat sink on a first electronics card is coupled to a first card guide in a chassis. The coupling is preferably accomplished through the use of a first clamping device that conducts heat from the first electronics card. The first clamping device may also rigidly secure the first electronics card in the chassis, thereby reducing the effects of vibrations. The first clamping device may be a wedgelock. This arrangement preferably allows the conduction of heat from heat-producing electronics on the first electronics card to the first card guide via the first heat sink and the first clamping device.

The first electronics card may also contain a mezzanine card mounting location. When a mezzanine card is installed into the mezzanine card mounting location, heat is preferably conducted from the mezzanine card to the first heat sink, thus cooling the mezzanine card.

At step 412, a second heat sink on a second electronics card is coupled to a second card guide in the chassis. The coupling is preferably accomplished through the use of a second clamping device that conducts heat from the second electronics card. The second clamping device may also rigidly secure the second electronics card in the chassis, thereby reducing the effects of vibrations. The second clamping device may also be a wedgelock. Similarly to that of the first electronics card, this arrangement preferably allows the conduction of heat from heat-producing electronics on the second electronics card to the second card guide via the second heat sink and the second clamping device. Like the first electronics card, the second electronics card may also contain a mezzanine card mounting location such that a mezzanine card installed into the second electronics card will be cooled by the second heat sink.

At step 414, an airflow is provided, further cooling the first and second electronics cards. The airflow may be generated by natural convection, by air propelled by a fan that is either internal to or external from the chassis, or by other means. The airflow may also cool more electronics cards and other chassis components, such as mezzanine cards, card guides and cold walls.

FIG. 5 depicts flow chart 500 for cooling an electronics card in a chassis. At step 510, a first thermal connection is maintained between an electronics card secured in a card guide of the chassis and a cold wall of the chassis. Preferably, the cold wall is arranged to dissipate heat from the chassis. At step 512, a second thermal connection is maintained between the electronics card and the cold wall through a clamping device. Preferably, the clamping device conducts heat from the electronics card. The clamping device may also rigidly secure the electronics card in the card guide, thereby reducing the effects of vibrations. The clamping device may be a wedgelock. The first and second thermal connections preferably allow heat from heat-producing electronics on the electronics card to be conducted to the cold wall, where it is dissipated.

At step 514, a third thermal connection is maintained between a mezzanine card installed in a mezzanine mounting location on the electronics card and a heat sink on the electronics card. With this arrangement, heat is conducted from the mezzanine card to the heat sink through the third thermal connection, and then from the heat sink to the cold wall through the first and second thermal connections. At step 516, an air flow is provided to cool the electronics card, including the mezzanine card. The airflow may be generated by natural convection, by air propelled by a fan that is either internal to or external from the chassis, or by other means. The airflow may also cool other electronics cards and other parts of the chassis, such as card guides and cold walls.

Exemplary embodiments of the present invention have been described above. Those skilled in the art will understand, however, that changes and modifications may be made to these embodiments without departing from the true scope and spirit of the invention, which is defined by the claims.

What is claimed is:

1. A system for securing and cooling electronics cards in a chassis, the system comprising:

an electronics card containing: (i) heat-producing electronics, and (ii) a heat sink comprising edge and a face, wherein the heat-producing electronics are coupled to the face to conduct heat away from the heat-producing electronics;
 the chassis comprising a vent and enclosing a card guide steering the placement of the electronics card and dissipating heat from the electronics card; and
 a clamping device securing the edge of the heat sink to the card guide whereby (i) the edge of the heat sink is coupled with the card guide, thereby dissipating heat from the heat sink to the card guide, (ii) the heat sink is coupled to the clamping device and the clamping device is coupled to the card guide, thereby further dissipating heat from the edge of the heat sink to the card guide via the clamping device, and (iii) the edge of the heat sink is rigidly secured to the card guide, thereby reducing the effects of vibrations;
 wherein air flows through the vent and over the face of the heat sink electronics card to further cool the heat-producing electronics coupled to the face of the heat sink.

2. The system of claim 1, comprising a fan unit, wherein the fan unit forces the air flow over the electronics card and through the vent.

3. The system of claim 1, wherein the heat-producing electronics comprise at least one of a central processing unit (CPU), application-specific integrated circuit (ASIC), field-programmable gate array (FPGA), digital signal processor (DSP), network processor, graphics processing unit (GPU), memory unit, communication interface, and communication bus.

4. The system of claim 1, wherein the heat sink comprises a material selected from the group consisting of aluminum, copper, graphite, and carbon fiber.

5. The system of claim 1, wherein the electronics card comprises a mezzanine card installed into a mezzanine card mounting location on the electronics card.

6. The system of claim 5, wherein the mezzanine card is coupled with the heat sink and heat is conducted from the mezzanine card to the heat sink.

7. The system of claim 1, wherein the chassis further encloses a cold wall capable of dissipating heat, wherein the cold wall is coupled to the card guide, thereby conducting heat from the card guide to the cold wall.

8. The system of claim 1, the electronics card further comprising a plurality of elements extending from the heat sink to improve convection cooling of the electronics card.

9. A method for cooling electronics cards in a chassis, wherein a first electronics card contains a first heat sink comprising an edge and a face, and a first set of heat-producing electronics coupled to the face of the first heat sink, and wherein the chassis comprises a vent and contains a first card guide, and the first electronics card, the method comprising:

coupling the edge of the first heat sink and the first card guide with a first clamping device that rigidly secures the edge of the first heat sink to the first card guide, thereby conducting heat from the first set of heat-producing electronics through the face of the first heat sink, through the first heat sink and through the edge of the first heat sink to the first card guide; and
 providing an air flow through the vent over the face of the first heat sink, thereby further cooling the first heat sink.

10. The method of claim 9, wherein a second electronics card contains a second heat sink comprising an edge and a face and a second set of heat-producing electronics coupled to the face of the second heat sink, and wherein the chassis also contains a second card guide, the method further comprising:

coupling the edge of the second heat sink to the second card guide with a second clamping device that rigidly secures the edge of the second heat sink to the second card guide, thereby conducting heat from the second set of heat-producing electronics through the face of the second heat sink through the second heat sink, and through the edge of the second heat sink to the second card guide, wherein the provided air flow further cools the second heat sink.

11. The method of claim 9, wherein the first clamping device further conducts heat from the first heat sink to the first card guide.

12. The method of claim 9, wherein the first electronics card further contains a mezzanine card installed into a mezzanine card mounting location on the first electronics card.

13. The method of claim 12, further comprising coupling the mezzanine card and the first heat sink, thereby conducting heat from the mezzanine card to the first heat sink.

14. The method of claim 9, wherein the air flow is provided by a fan unit forcing the air flow through the vent in the chassis over the first electronics card.

15. The method of claim 9, wherein the first electronics card comprises a plurality of elements extending from the first heat sink to improve convection cooling of the first electronics card.

16. The method of claim 10, wherein the second electronics card comprises a plurality of elements extending from the second heat sink to improve convection cooling of the second electronics card.

17. A method for producing a conduction cooling path in a convection-cooled chassis, the chassis comprising (i) a cold wall, (ii) a plurality of card guides for housing electronics cards, wherein at least one of the electronics cards comprises a heat sink, the card guides coupled to the cold wall, (iii) a vent, and (iv) an air flow path through the vent for cooling the at least one electronics card secured in one of the plurality of card guides, the method comprising:
maintaining a first thermal connection between an edge of the heat sink of the at least one electronics card secured in the one of the plurality of card guides and the cold wall, thereby cooling the at least one electronics card by conducting heat from the at least one electronics card through the edge of the heat sink to the cold wall;
maintaining a second thermal connection between the edge of the heat sink of the at least one electronics card and the cold wall through a clamping device, thereby cooling the at least one electronics card by further conducting heat from the at least one electronics card through the edge of the heat sink to the cold wall; and
further cooling the at least one electronics card with an air flow through the air flow path over a face of the heat sink to cool the heat sink.

18. The method of claim 17, further comprising rigidly securing the edge of the heat sink to the one of the plurality of card guides with the clamping device, thereby reducing the effects of vibrations.

19. The method of claim 17, wherein the electronics card contains a mezzanine card mounting location.

20. The method of claim 19, the method further comprising maintaining a third thermal connection between a mezzanine card installed into the mezzanine card mounting location and the heat sink, thereby conducting heat from the mezzanine card to the heat sink.

21. The method of claim 17, wherein the air flow is provided by a fan unit forcing air through the vent in the chassis.

22. The method of claim 17, wherein the at least one electronics card comprises a plurality of elements extending from the heat sink to improve convection cooling of the at least one electronics card.

* * * * *